United States Patent [19]

Braun et al.

[11] Patent Number: 5,031,025
[45] Date of Patent: Jul. 9, 1991

[54] HERMETIC SINGLE CHIP INTEGRATED CIRCUIT PACKAGE

[75] Inventors: Robert E. Braun, Norristown; Ronald T. Gibbs, King of Prussia, both of Pa.

[73] Assignee: Unisys Corporation, Blue Bell, Pa.

[21] Appl. No.: 481,919

[22] Filed: Feb. 20, 1990

[51] Int. Cl.[5] .................... H01L 23/04; H01L 23/02
[52] U.S. Cl. ............................... 357/74; 357/75; 357/81; 357/80
[58] Field of Search .......................... 357/74, 81

[56] References Cited

U.S. PATENT DOCUMENTS

| | | | |
|---|---|---|---|
| 3,312,771 | 4/1967 | Hessinger et al. | 174/52.3 |
| 4,278,991 | 7/1981 | Ritchie et al. | 357/81 |
| 4,285,002 | 8/1981 | Campbell | 357/74 |
| 4,748,538 | 5/1988 | Tsuji | 361/368 |
| 4,903,113 | 2/1990 | Frankeny et al. | 357/74 |
| 4,905,075 | 2/1990 | Temple et al. | 357/74 |
| 4,922,324 | 5/1990 | Sudo et al. | 357/74 |
| 4,926,242 | 5/1990 | Itoh et al. | 357/74 |
| 4,943,844 | 7/1990 | Oscilowski et al. | 357/74 |

FOREIGN PATENT DOCUMENTS 59-67661 4/1984 Japan .

*Primary Examiner*—Jerome Jackson, Jr.
*Assistant Examiner*—Daniel N. Russell
*Attorney, Agent, or Firm*—Mark T. Starr; Thomas J. Scott

[57] ABSTRACT

An individual integrated circuit package utilizing an intermediate die carrier having legs in contact with a wiring substrate and a compatible lid to effect hermeticity. More specifically, the carrier includes on its outer surface a raised section and a peripheral ledge. The cap is formed with a cutout in its closed extremity to accommodate the raised carrier section and the portions of the cap adjacent the cutout rest upon and are sealed to the carrier ledge. The rim of the cap at its open extremity contacts and is sealed to the substrate to form the completed hermetic package.

8 Claims, 3 Drawing Sheets

HERMETIC SINGLE CHIP INTEGRATED CIRCUIT PACKAGE

BACKGROUND OF THE INVENTION

The housing of semiconductor devices has assumed increasing importance with recent technological developments in the field of logic design. Large chip or die sizes, higher power dissipation and an increased input-/output lead count are characteristic of such devices. It is advantageous for a wide variety of applications to mount each device in an individual, that is, single chip hermetic package.

Traditionally, high powered single chip logic die have been mounted in ceramic packages with a cavity down configuration. With this approach, the die is mounted with the back surface of the die against the top of the package, so that heat can be removed from the back or rear surface of the die. The output pins are mounted on the opposite surface. A cover or lid to provide hermetic protection for the die is also mounted on this surface. The problem with this structure is that the increasing die size requires a larger cavity and lid, forcing the input/output pins to move outboard and increasing the overall package size. This is contrary to the requirements for high performance system packaging where a smaller package with low capacity and inductance is required.

The problem of increased input/output pins and concomitant overall package size is addressed in U.S. Pat. No. 4,748,538 to Mutsuo Tsuji, entitled "Semiconductor Module". The patent illustrates a multichip configuration in which an intermediate carrier comprising a planar rectangular member with legs at its corners is disposed on a multi-layer wiring substrate. The legs provide an air space between the adjacent faces of the member and the substrate. The semiconductor chip is fixed to the face of the member within the air space. Lead wires extend outwardly from the chip and are bent to contact lead terminals on the adjacent face of the substrate. The opposite face of the substrate is populated with input/output pins coupled to the lead terminals.

What is desired, but not envisioned in the aforementioned patent, is a semiconductor package which retains the advantages of the intermediate carrier but also houses a single chip and is hermetically sealed. The present invention fills such a need.

SUMMARY OF THE INVENTION

In accordance with the present invention there is provided a single chip, hermetically sealed integrated circuit package. The assembly uses an intermediate carrier to which the die is attached. This construction is similar to that described in the aforementioned Tsuji patent. In contrast however, while the patent illustrates a multi chip arrangement with no provision for an hermetic lid, the present invention utilizes the carrier to form a hermetic package. This is accomplished by modifying the outer face of the carrier opposite to the face to which the die is attached. The modification involves the formation of a continuous ledge surrounding the periphery of the outer face of the carrier to accommodate a lid and seal. The lid contains a cutout of substantially the same geometrical shape and dimensions as the raised portion of the outer face of the carrier which is surrounded by the ledge. Accordingly, when the lid is positioned over the carrier, the raised portion of the carrier face remains exposed to the external environment and portions of the lid surrounding the cutout rest upon and are sealed to the ledge.

If desired, the thickness of the ledge in the carrier face may be selected such that the outer surface of the lid adjacent the cutout is substantially coplanar with the exposed surface of the carrier after the lid has been sealed. The lid extends outwardly a predetermined distance from the ledge in a plane parallel to that of the substrate and then is disposed substantially at right angles to contact the substrate and be sealed thereto. Sealing of the lid to the substrate may take the form of a flange seal on the periphery of the inner planar surface of the substrate or an edge seal along the transverse edge of the substrate.

The foregoing structure provides a single chip hermetic package which solves the problem of the high pin count, high power packaging of integrated circuit chips. The present package exhibits a number of advantages. It permits heat removal from the exposed surface of the carrier; it minimizes the size of the package by allowing the entire outer surface of the substrate to be populated by input/output pins. More significantly, the tolerance involved in the carrier and lid components of the package, while they must be carefully controlled, are not so critical as to present fabrication difficulties.

Other features and advantages of the present package will become apparent in the detailed description of the invention which follows.

DESCRIPTION OF THE PREFERRED EMBODIMENTS

Figure 1:
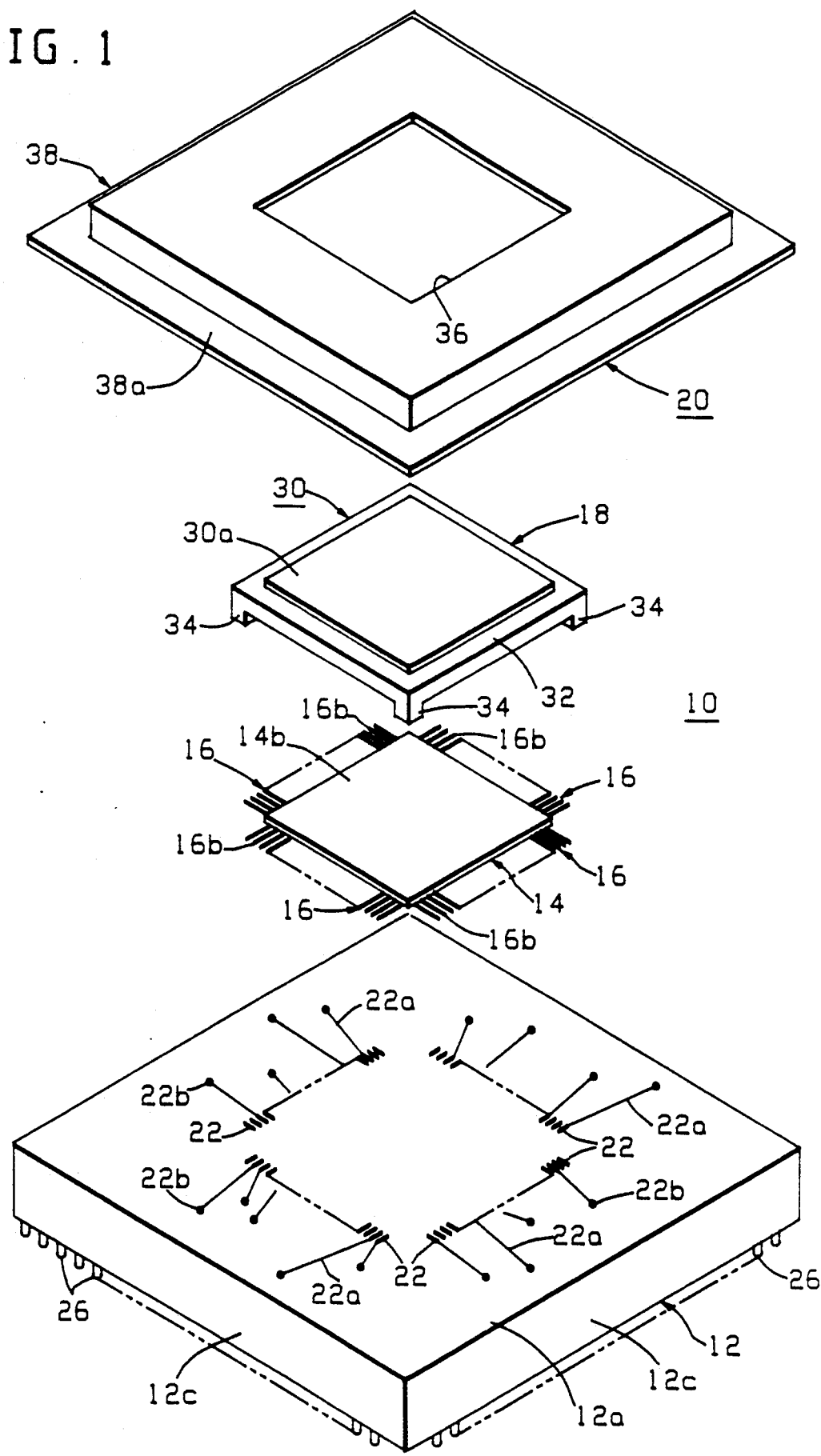
FIG. 1 is an exploded view depicting the elements of the single chip hermetic package of the present invention.

With reference to FIG. 1, there are illustrated the elements of the present integrated circuit package 10, namely a wiring substrate 12, a die 14 with lead frames 16 for Tape Automated Bonding (TAB) attached thereto, an intermediate carrier 18 and a lid 20.

Considering each of the above named elements, the substrate 12 is of the multi-layer type. Pluralities of lead terminals 22 are disposed on the inner surface 12a of the substrate 12. The lead terminals 22 are coupled by way of lines 22a, via holes 22b, and the internal wiring 24 (FIG. 3) of the substrate 12 to input/output pins 26 on the outer surface 12b of the substrate.

A single chip logic die 14 is illustrated. With additional reference to FIG. 3, the die 14 has tape lead frames 16 with the inner lead extremities 16a being bonded to the peripheral signal pads 28 on the active front surface 14a of the die 14. The outer lead extremities 16b of the lead frame 16 are adapted to be bonded to the lead terminals 22 of substrate 12.

An intermediate carrier 18 is illustrated. The carrier comprises a substantially planar rectangular section 30 having in its outer surface a raised central portion 30a with a continuous ledge 32 disposed adjacent its periphery. A carrier mounting leg 34 is positioned at each corner of the carrier.

Finally, a cover or lid 20, in an inverted cup-like form, is depicted having a rectangular cutout 36 to accommodate the raised central portion 30a of the carrier 18. The periphery of the lid adjacent the cutout 36 is adapted to rest upon and to be sealed to the carrier ledge 32. The open extremity of the lid 20 includes a rim 38 configured as a flange 38a adapted to contact and to be sealed to the inner surface 12a of the substrate 12.

Figure 2:
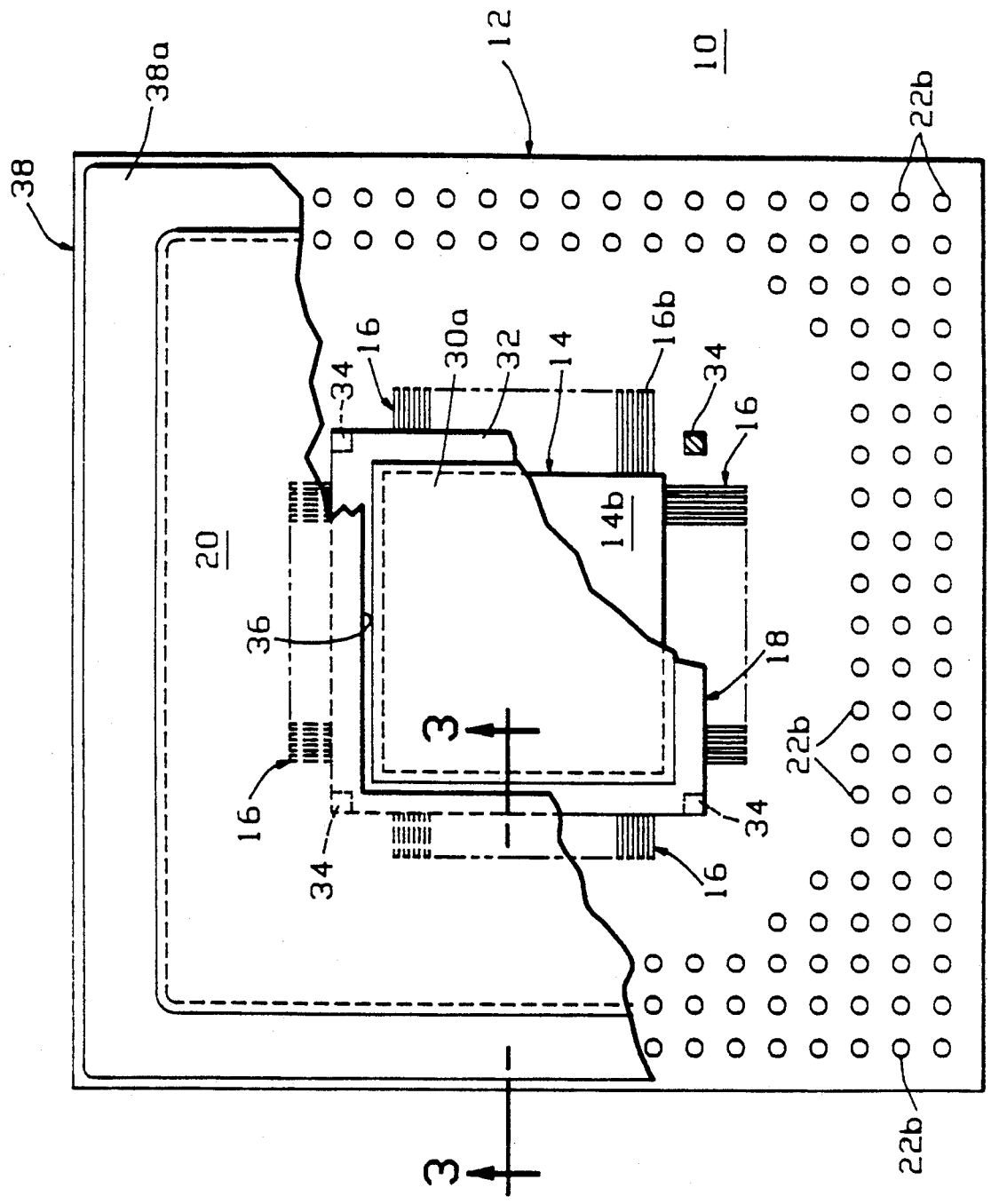
FIG. 2 is a plan view of the assembled package.

With continued reference to FIG. 1, the assembly of elements to form the completed package illustrated in FIGS. 2 and 3, will be described. In general terms, the back surface 14b of the die 14, opposite to that to which the inner lead frame 16a is bonded, is attached to the inner surface 30b of the carrier 18. The carrier 18 is fabricated from a material, such as copper tungsten, which has good thermal conductivity and a thermal coefficient of expansion that is compatible with that of die 14. The carrier legs 34 rest upon the substrate inner surface 12a and the outer lead frame 16b is bonded to the lead terminals 22 on the inner substrate surface 12a. The lid 20 is then placed over the carrier, allowing the raised central portion 30a of the carrier 18 to be exposed via the lid cutout 36. The portions of the lid surrounding the cutout are then sealed to the carrier ledge 32, and the lid flange 38a is sealed to the inner surface 12a of the substrate 12.

More specifically, the assembly of the package is accomplished in the following manner. The chip or die 14 is attached to the inner planar surface 30b of the carrier 18 by a high temperature gold eutectic or silver glass bonding process. The inner tape frame leads 16a are thermo-compression bonded to the die pads 28. The die and carrier assembly with the lead frame attached, is then placed into contact with the package substrate 12. The outer tape frame leads 16b are thermo-compression bonded to the lead terminals 22 on the substrate 12. The tape frame to substrate attachment may be a tin-to-tin or gold-to-tin bond. The legs 34 of the carrier are glued or otherwise attached to the substrate surface, or alternately, they rest unattached on the substrate surface 12a, with support coming from the tape outer lead bond. As to the hermetic seal afforded by the lid to carrier interface, a form of laser welding or soldering provides localized heat which is high enough to insure package integrity but low enough as not to adversely affect the tape lead frame bonds. The rim flange is soldered to the inner surface of the substrate by a similar process.

Figure 3:
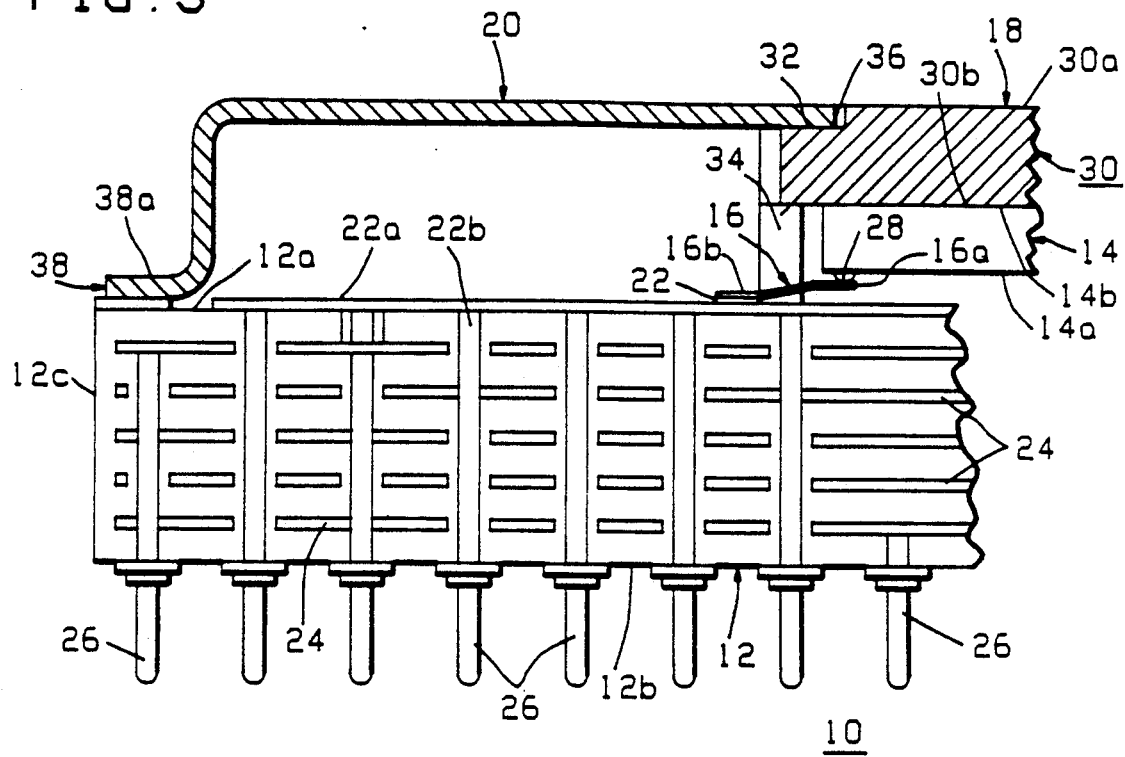
FIG. 3 is an enlarged section view of the assembled package taken along the lines 3 - 3 of FIG. 2 and illustrating particularly the sealing relationship of the lid to the carrier and substrate.
Figure 4:
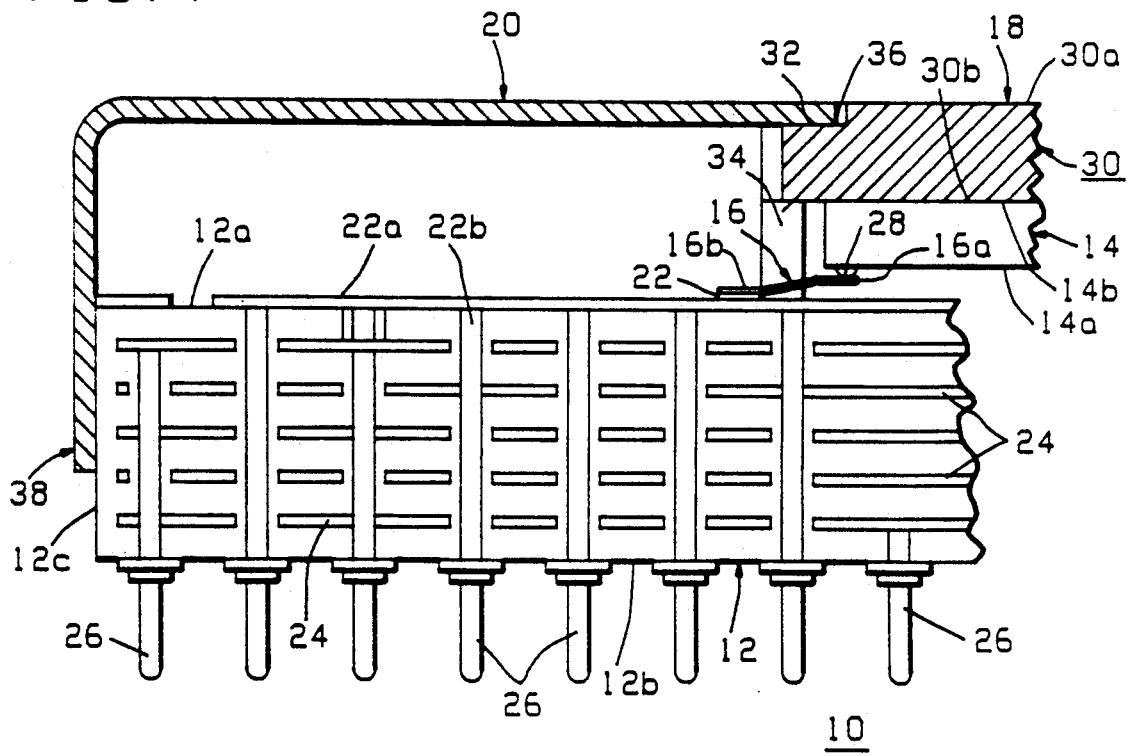
FIG. 4 is an enlarged section view similar to that of FIG. 3 but depicting an alternate sealing arrangement of the lid to the substrate.

In FIG. 4, the rim 38 of the open extremity of the lid 20 does not have the flange 38a seen in FIG. 3. Instead of contact with the inner surface 12a of the substrate 12 to effect a seal, the rim 38 is disposed adjacent the transverse edge 12c of the substrate and is sealed thereto by soldering.

In conclusion, there has been disclosed a packaging technology which is consistent with the present state of the silicon chip art. The hermetic package of the present invention provides a housing for a chip having high power dissipation and a large input/output pin count. It should be noted that the details of the assembly process of the package including the sealing materials and methods have been presented solely for purposes of example, and are not to be construed as limitative of the invention. Changes and modifications in the package and its assembly, which are well within the skill of the designer may be required to suit particular applications. Such changes and modifications, in so far as they are not departures from the scope of the invention, are intended to be covered by the claims which follow.

What is claimed is:

1. An hermetic single chip integrated circuit package comprising:

a wiring substrate having an inner and an outer planar surface, a plurality of lead terminals disposed on the inner substrate surface, a plurality of input/output terminals disposed on substantially the entire outer substrate surface, a die having a front surface and a back surface, a plurality of signal pads disposed on the periphery of the front die surface, a plurality of tape lead frames each having a plurality of leads lying substantially in the same plane as said front surface of said die, said leads having their inner extremities bonded respectively to said pads, an intermediate carrier comprising a substantially planar carrier section and a plurality of legs adjacent the carrier section and oriented at right angles thereto, said carrier section having a shape corresponding to that defined by the positions of said lead terminals, said carrier section having an inner surface and an outer surface, said back surface of said die being attached to said inner surface of said carrier section, said front surface of said die and said inner substrate surface being disposed in parallel spaced-apart relationship, said legs of said carrier contacting said inner surface of said substrate, the outer extremities of said plurality of leads being bonded to said lead terminals on said inner substrate surface, said front surface of said die and said inner substrate surface being positioned in close proximity to each other such that the angle defined by said leads bonded to said lead terminals and the lead-to-terminal distances are both minimized, the outer surface of said carrier section having a central portion raised with respect to a continuous ledge formed adjacent the periphery of said portion, a lid having a cup-like configuration, said lid having a cutout centrally disposed in its closed extremity and a rim defining its open extremity, said lid being oriented with respect to said carrier such that said raised central portion of said outer surface of said carrier is disposed within said cutout, the portions of said lid adjacent said cutout being rested upon and being sealed to said ledge of said carrier, said rim of said lid being sealed to said substrate, thereby forming an hermetic package.

2. An hermetic integrated circuit package as defined in claim 1 wherein said wiring substrate is of the multilayer type, said lead terminals being coupled to said input/output terminals.

3. An hermetic integrated circuit package as defined in claim 2 wherein said rim of said lid is comprised of a flange, said flange being sealed to said inner substrate surface.

4. An hermetic integrated circuit package as defined in claim 2 wherein said rim of said lid is sealed to the peripheral transverse edge of said substrate.

5. An hermetic integrated circuit package as defined in claim 3 further characterized in that the central raised portion of the outer surface of said carrier is rectangular, said cutout of said lid having substantially the same geometrical shape and dimensions as said raised portion.

6. An hermetic integrated circuit package as defined in claim 5 further characterized in that the thickness of said ledge relative to said raised central portion of said carrier is such that the portions of said lid adjacent said cutout are coplanar with said central raised portion.

7. An hermetic integrated circuit package as defined in claim 6 wherein said legs of said carrier are attached to said inner substrate surface.

8. An hermetic integrated circuit package as defined in claim 6 characterized in that said carrier is formed of thermally conductive material having a thermal coefficient of expansion compatible with that of said die.

* * * * *